(12) United States Patent
Osanai

(10) Patent No.: US 9,467,138 B2
(45) Date of Patent: Oct. 11, 2016

(54) SEMICONDUCTOR APPARATUS

(71) Applicant: TOYOTA JIDOSHA KABUSHIKI KAISHA, Toyota-shi, Aichi-ken (JP)

(72) Inventor: Yosuke Osanai, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/734,705

(22) Filed: Jun. 9, 2015

(65) Prior Publication Data

US 2016/0020763 A1      Jan. 21, 2016

(30) Foreign Application Priority Data

Jul. 16, 2014   (JP) ................................. 2014-146223

(51) Int. Cl.
H03K 17/56       (2006.01)
H03K 17/567      (2006.01)
H03K 17/042      (2006.01)

(52) U.S. Cl.
CPC .......... *H03K 17/567* (2013.01); *H03K 17/042* (2013.01)

(58) Field of Classification Search
CPC .. H03K 17/56; H03K 17/567; H03K 17/042; H03K 17/60; H03K 17/168
USPC ............ 315/76, 80, 291, 293; 327/108, 365, 327/376, 377, 427, 429, 432, 434; 361/18, 361/91.2, 93.1, 94, 98, 101
See application file for complete search history.

(56) References Cited

U.S. PATENT DOCUMENTS

| | | | | |
|---|---|---|---|---|
| 6,057,728 A | * | 5/2000 | Igarashi | H03K 17/0828 327/427 |
| 2004/0027762 A1 | * | 2/2004 | Ohi | H03K 17/168 361/100 |
| 2005/0017788 A1 | * | 1/2005 | Inoue | H03K 17/0406 327/432 |
| 2009/0057832 A1 | * | 3/2009 | Kouno | H01L 29/7397 257/577 |
| 2010/0156506 A1 | * | 6/2010 | Tsuzuki | H01L 27/0664 327/478 |
| 2012/0153719 A1 | * | 6/2012 | Inaba | B60L 3/003 307/10.1 |

FOREIGN PATENT DOCUMENTS

| | | |
|---|---|---|
| JP | 2005-045590 A | 2/2005 |
| JP | 2014-187736 A | 10/2014 |

* cited by examiner

*Primary Examiner* — Thai Pham
(74) *Attorney, Agent, or Firm* — Oliff PLC

(57) ABSTRACT

A semiconductor apparatus includes a switching element configured to include a gate electrode, a first main electrode, a second main electrode, a sense electrode to output a sense current smaller than a principal current depending on the principal current flowing in the first main electrode, and to turn off when a control voltage being applied between the gate electrode and the first main electrode is reduced; a sense diode configured to include an anode connected with the sense electrode, and a cathode connected with the second main electrode; and a connection circuit configured to connect the gate electrode with the sense electrode when the switching element turns off.

5 Claims, 8 Drawing Sheets

SEMICONDUCTOR APPARATUS

FIELD

The disclosures herein generally relate to a semiconductor apparatus.

BACKGROUND

Conventionally, a technology has been known that improves responsiveness of a turn-off operation of a switching element such as an IGBT, by increasing a discharge current of the gate electrode when turning off the switching element (see, for example, Patent Document 1).

RELATED-ART DOCUMENTS

Patent Documents

[Patent Document 1] Japanese Laid-open Patent Publication No. 2005-45590

However, the conventional art described above has a limit in speeding up a turn-off operation because it discharges electric charge accumulated in the gate electrode to ground when turning off the switching element.

Thereupon, it is an object of at least one embodiment of the present invention to provide a semiconductor apparatus that can speed up a turn-off operation of a switching element.

SUMMARY

According to an embodiment of the present invention, a semiconductor apparatus includes a switching element configured to include a gate electrode, a first main electrode, a second main electrode, a sense electrode to output a sense current smaller than a principal current depending on the principal current flowing in the first main electrode, and to turn off when a control voltage being applied between the gate electrode and the first main electrode is reduced; a sense diode configured to include an anode connected with the sense electrode, and a cathode connected with the second main electrode; and a connection circuit configured to connect the gate electrode with the sense electrode when the switching element turns off.

According to an embodiment of the present invention, it is possible to speed up a turn-off operation of the switching element, by having the gate electrode and the sense electrode connected with each other when turning off the switching element, to charge the second main electrode by the electric charge of the gate electrode via the sense diode.

DESCRIPTION OF EMBODIMENTS

In the following, embodiments of the present invention will be described with reference to the drawings.

Figure 1:
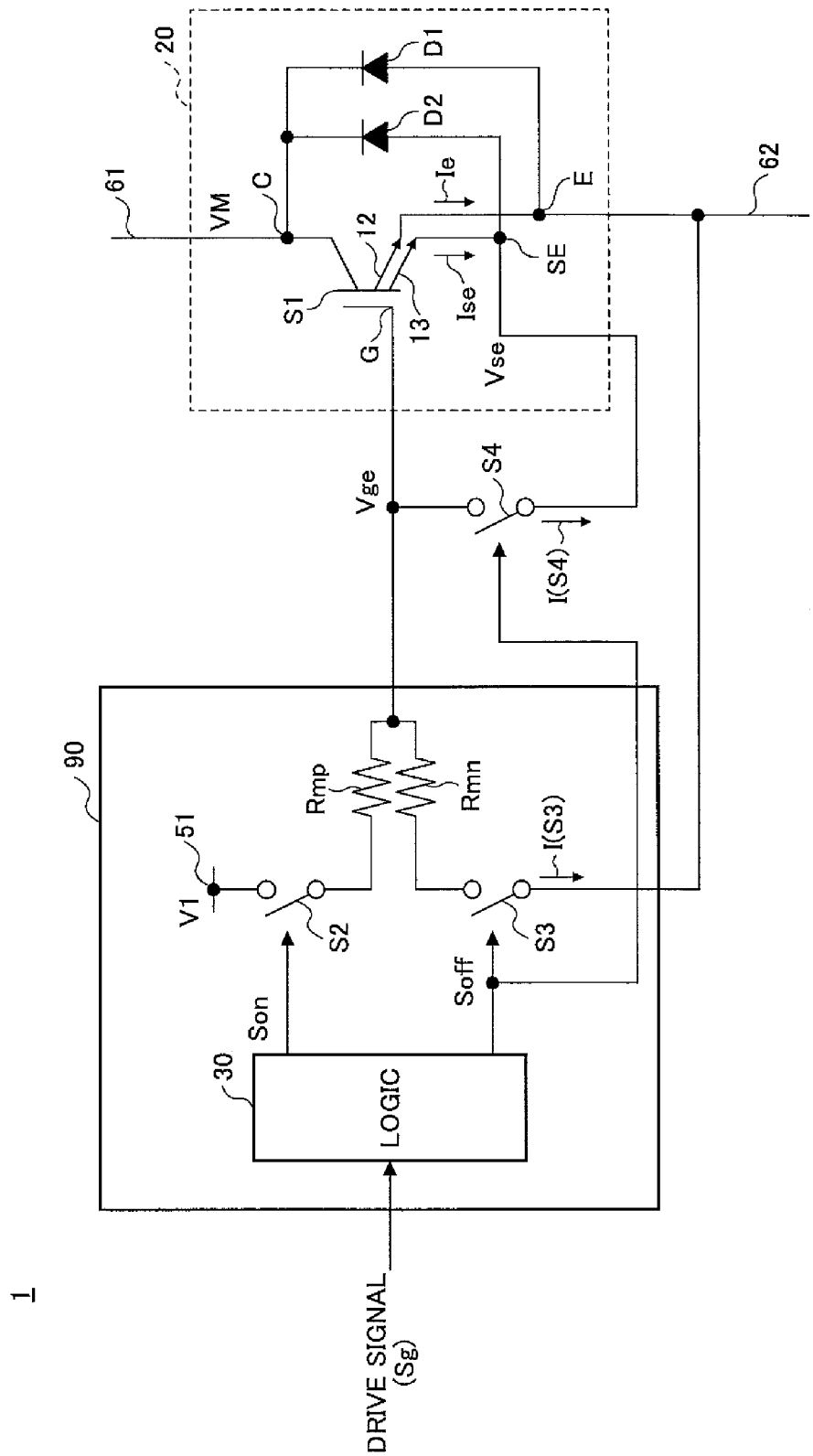
FIG. 1 is a configuration diagram illustrating an example of a semiconductor apparatus.

FIG. 1 is a diagram illustrating a configuration example of a drive apparatus 1 as an example of a semiconductor apparatus. The drive apparatus 1 is a semiconductor circuit that includes a unit to drive an inductive load (for example, an inductor or a motor) connected with a first conductive part 61 or a second conductive part 62, for example, by driving on and off a switching element S1.

The conductive part 61 is a current path that is conductively connected with a high-power-potential part, for example, a positive electrode of a power source, or may be indirectly connected with the high-power-potential part via another switching element or a load. The conductive part 62 is a current path that is conductively connected with a low-power-potential part (for example, a ground potential part), for example, a negative electrode of a power source, or may be indirectly connected with the low-power-potential part via another switching element or a load.

Apparatuses that use one or more drive apparatuses 1 include, for example, a power conversion apparatus that converts electric power between its input and output by driving on and off the switching element S1. A specific example of such a power conversion apparatus may be a converter that boosts or steps down DC power; an inverter that converts power between DC power and AC power; and the like.

The drive apparatus 1 includes the switching element S1. The switching element S1 is an insulation-gate-type voltage-controlled semiconductor element having a current sense function, for example, an IGBT (Insulated Gate Bipolar Transistor) having a gate G, a collector C, an emitter E, and a sense emitter SE.

The gate G is an example of a gate electrode that is connected with, for example, a gate control circuit 90. The gate G is connected with, for example, a drive power source 51 via a gate-on resistor Rmp and a gate-on switch S2 that are connected in series with the gate G, and connected with the conductive part 62 and the emitter E via a gate-off resistor Rmn and a gate-off switch S3 that are connected in series with the gate G. The drive power source 51 is a high-power-potential part that outputs a power supply voltage V1 that is higher than the voltage of the conductive part 62. The gate G is connected with, for example, an intermediate node, with which the gate-on resistor Rmp and the gate-off resistor Rmn are connected.

The emitter E is an example of a first main electrode, and connected with, for example, the conductive part 62. The collector C is an example of a second main electrode, and connected with, for example, the conductive part 61. The sense emitter SE is an example of a sense electrode, and outputs, for example, a sense current Ise that is smaller than a principal current Ie, depending on the principal current Ie that flows in the emitter E.

The drive apparatus 1 includes a sense diode D2. The sense diode D2 is an example of a rectifier that has an anode connected with the sense emitter SE, and a cathode connected with the collector C.

The drive apparatus 1 includes a gate control circuit 90. The gate control circuit 90 is a circuit that controls turning on and off the switching element S1. The gate control circuit 90 includes the gate-on switch S2, the gate-on resistor Rmp, the gate-off switch S3, the gate-off resistor Rmn, and a logic circuit 30. The gate-on switch S2 is, for example, a P-channel MOSFET (Metal Oxide Semiconductor Field Effect Transistor), and the gate-off switch S3 is, for example, an N-channel MOSFET.

The logic circuit 30 is a control unit that controls the gate voltage Vge of the gate G of the switching element S1 to be a voltage for turning on and off the switching element S1 via the gate-on resistor Rmp or the gate-off resistor Rmn, following a drive signal Sg supplied from the outside.

The drive signal Sg is a command signal for commanding to turn on and off the switching element S1, which is supplied from the outside of the drive apparatus 1, and connected with a control apparatus at a level higher than the drive apparatus 1 (for example, a pulse width modulation signal). The control apparatus is, for example, a microcomputer by itself, or an, apparatus that includes a microcomputer.

The gate voltage Vge is a control voltage that is applied between the gate G and the emitter E. The switching element S1 turns on or off depending on a value of the gate voltage Vge.

Following the drive signal Sg commanding to turn on the switching element S1, the logic circuit 30 sets the turn-on signal Son to an active level, and sets the turn-off signal Soff to a non-active level. By setting the turn-on signal Son to the active level, the logic circuit 30 turns on the gate-on switch S2, and by setting the turn-off signal Soff to the non-active level, the logic circuit 30 turns off the gate-off switch S3. Having the gate-on switch S2 turned on and the gate-off switch S3 turned off, makes the gate G be pulled up to the drive power source 51 via the gate-on resistor Rmp. This makes the gate voltage Vge rise to a voltage greater than the gate threshold voltage of the switching element S1, and hence, the switching element S1 turns on.

On the other hand, following the drive signal Sg commanding to turn off the switching element S1, the logic circuit 30 sets the turn-on signal Son to the non-active level, and sets the turn-off signal Soff to the active level. By setting the turn-on signal Son to the non-active level, the logic circuit 30 turns off the gate-on switch S2, and by setting the turn-off signal Soff to the active level, the logic circuit 30 turns on the gate-off switch S3. Having the gate-on switch S2 turned off and the gate-off switch S3 turned on, makes the gate G be pulled down to the conductive part 62 via the gate-off resistor Rmn. This makes the gate voltage Vge fall down to a voltage less than the gate threshold voltage of the switching element S1, and hence, the switching element S1 turns off.

Here, in a state where the switching element S1 is stable in an on state, the gate voltage Vge is virtually equivalent to the power supply voltage V1 (high-level voltage), and if neglecting the on voltage (on resistance) of the switching element S1, the collector voltage VM is virtually equivalent to the voltage of the conductive part 62 (low-level voltage). Conversely, in a state where the switching element S1 is stable in an off state, the gate voltage Vge is virtually equivalent to the voltage of the conductive part 62 (low-level voltage), and the collector voltage VM is virtually equivalent to the voltage of the conductive part 61 (high-level voltage). Note that the collector voltage VM is the voltage of the collector C, or more specifically, the voltage between the collector C and the emitter E.

Therefore, when the switching element S1 turns off from an on state to an off state, the gate voltage Vge falls from the high-level voltage to the low-level voltage, whereas the collector voltage VM rises from the low-level voltage to the high-level voltage.

Thereupon, the drive apparatus 1 includes a switch S4 for speeding up a turn-off operation of the switching element S1. The switch S4 is an example of a connection circuit that connects the gate G with the sense emitter SE when the switching element S1 turns off.

By having the gate G connected with the sense emitter SE by the switch S4 when the switching element S1 turns off, the electric charge of the gate G moves to the collector C via the sense diode D2, and hence, it is possible to discharge the gate G and to charge the collector C at the same time. Therefore, falling speed of the gate voltage Vge (discharging speed of the gate G) can be raised when the switching element S1 turns off, and rising speed of the collector voltage VM (charging speed of the collector C) can be raised when the switching element S1 turns off.

In this way, the drive apparatus 1 can raise the falling speed of the gate voltage Vge when the switching element S1 turns off, and thus, can speed up a turn-off operation of the switching element S1 (in other words, shorten the turn-off time of the switching element S1). Also, by having the rising speed of the collector voltage VM raised when the switching element S1 turns off, a mirror period can be shortened when the switching element S1 turns off. The mirror period is a period during which the gate voltage Vge becomes temporarily constant when turning off. Therefore, the drive apparatus 1 can shorten the mirror period when the switching element S1 turns off, and hence, can speed up a turn-off operation of the switching element S1 even if a mirror period exists.

Also, the drive apparatus 1 uses the electric charge discharged from the gate G to charge the collector C, and hence, can efficiently implement speeding up a turn-off operation of the switching element S1 while preventing the power consumption from increasing.

Figure 2:
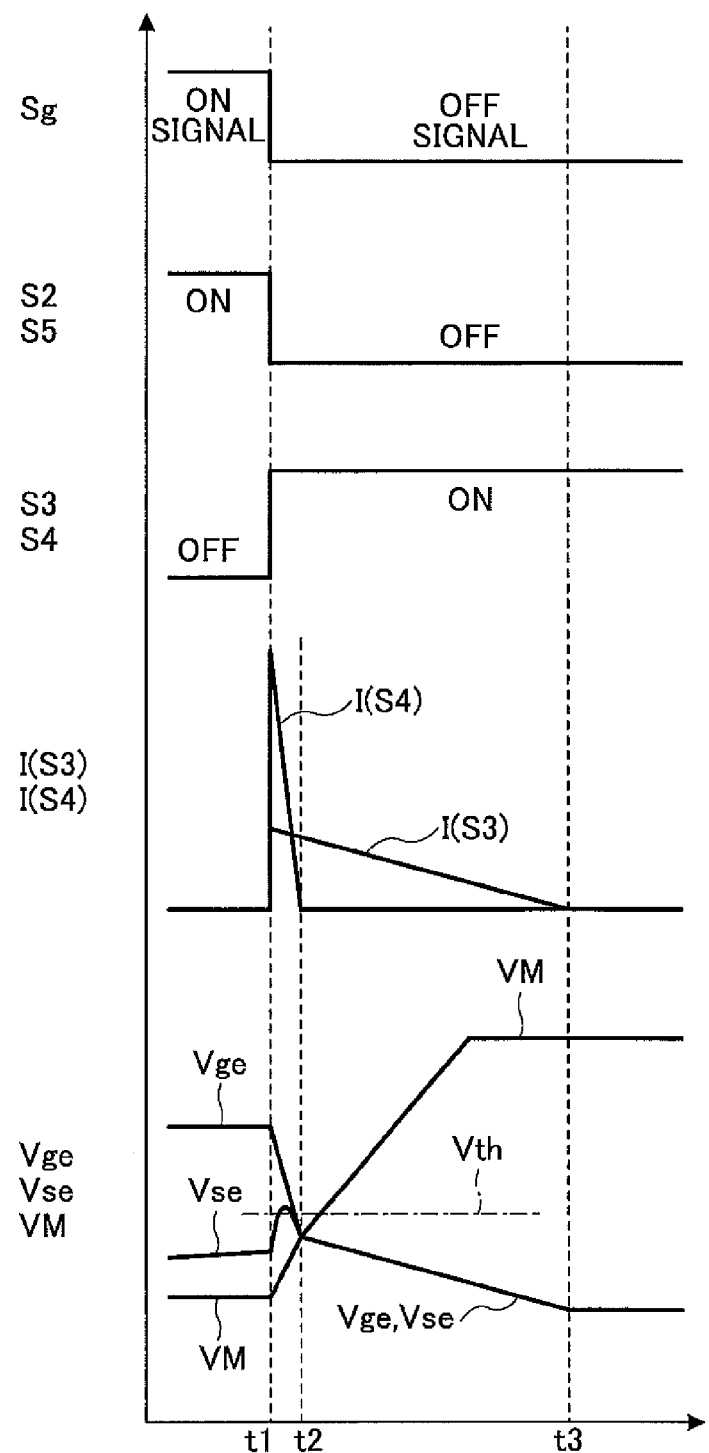
FIG. 2 is a timing chart illustrating an example of an operational waveform of a semiconductor apparatus.

FIG. 2 is a timing chart illustrating an example of an operational waveform of the semiconductor apparatus 1. Operations of the drive apparatus 1 will be described with reference to FIG. 2.

When the drive signal Sg changes at timing t1 from an on command to an off command, the switching element S1 starts a turn-off operation. At timing t1, the logic circuit 30 switches the gate-on switch S2 from on to off, and switches the gate-off switch S3 from off to on. By having the gate-off switch S3 turned on, the electric charge of the gate G is discharged to the conductive part 62 via the gate-off resistor Rmn, and hence, a current I (S3) flows in the gate-off switch S3.

Synchronizing with switching the gate-off switch S3 from off to on at timing t1, the logic circuit 30 also switches the switch S4 from off to on. By having the switch S4 turned on, the electric charge of the gate G flows in the collector C via the sense diode D2, and hence, the current I (S4) flows in the switch S4. Since the gate G is shorted to the sense emitter SE by the turned-on switch S4, the current I (S4) temporarily becomes greater than the current I (S3) flowing via the gate-off resistor Rmn.

In this way, the drive apparatus 1 can charge the collector C by the comparatively great current I (S4) generated by discharging the gate G, and hence, can speed up a turn-off operation of the switching element S1 during an earlier period t1-t2 of the turn-off operation of the switching element S1. Also, during the earlier period t1-t2, it is possible to discharge the gate G by a current having the current I (S3) and the current I (S4) put together, which is highly effective in speeding up a turn-off operation of the switching element S1.

When the collector voltage VM rises due to charging by the current I (S4), and becomes greater than the voltage (Vse-VF) (timing t2), the current I (S4) stops flowing due to a rectification characteristic of the sense diode D2, and charging the collector C stops. Vse is the voltage of the sense emitter SE, more specifically, the voltage between the sense emitter SE and the emitter E. VF is the forward voltage of the sense diode D2. Namely, the voltage (Vse-VF) is a difference voltage obtained by subtracting the forward voltage VF from the sense emitter voltage Vse.

Therefore, during a period where the collector voltage VM is comparatively high (namely, a later period t2-t3 of the turn-off operation of the switching element S1), the drive apparatus 1 can relax the speed of the turn-off operation because the current I (S3) smaller than that during the earlier period t1-t2 discharges the gate G. This can prevent a surge voltage that is generated when the switching element S1 turns off, from rising due to speeding up the turn-off operation.

Next, the configuration of FIG. 1 will be described in detail.

The switching element S1 includes, for example, a main transistor 12 and a sense transistor 13. The main transistor 12 is an example of a main element, and the sense transistor 13 is an example of a sense element having a smaller size than the main element. The main transistor 12 and the sense transistor 13 are switching elements such as IGBTs.

The gate G is commonly connected with respective gate electrodes of the main transistor 12 and the sense transistor 13. The emitter E is connected with the emitter electrode of the main transistor 12. The collector C is commonly connected with respective collector electrodes of the main transistor 12 and the sense transistor 13. The sense emitter SE is connected with the sense emitter electrode of the sense transistor 13.

The main transistor 12 is an example of a switching element. The sense transistor 13 is an example of a sense switching element that generates a current depending on a current flowing in the main transistor 12, and is a sense element in which a greater current flows when a greater current flows in the main transistor 12. The sense transistor 13 outputs, for example, the sense current Ise that is proportional to the principal current Ie flowing in the main transistor 12, and depending on the principal current Ie, outputs the sense current Ise that is smaller than the principal current Ie.

For example, the collector current flowing from the collector C into the switching element S1 is divided into the principal current Ie flowing in the main transistor 12, and the sense current Ise flowing in the sense transistor 13, by a sense ratio m. The sense current Ise is a current that flows depending on the principal current Ie by the sense ratio m, and its current value is made smaller than the principal current Ie by the sense ratio m. The sense ratio m is determined, for example, depending on a ratio of the area of the emitter electrode of the main transistor 12 and the area of the sense emitter electrode of the sense transistor 13.

The principal current Ie flows in the collector electrode and the emitter electrode of the main transistor 12, and is output from the emitter E. The sense current Ise flows in the collector electrode and the sense emitter electrode of the sense transistor 13, and is output from the sense emitter SE.

The sense diode D2 is disposed, for example, in a chip 20 that includes the switching element S1. The gate control circuit 90 or the switch S4 may be disposed in a chip other than the chip 20, or may be disposed in the same chip 20 as the switching element S1 is disposed.

The drive apparatus 1 includes, for example, a main diode D1. The main diode D1 includes a cathode connected with the collector C, and an anode connected with the emitter E. The main diode D1 may be disposed in the same chip 20 as the switching element S1 is disposed, or may be disposed in a chip other than the chip 20.

The switching element S1 is, for example, a diode-built-in IGBT that includes the main transistor 12, the sense transistor 13, the main diode D1, and the sense diode D2 disposed commonly in the chip 20. The diode-built-in IGBT has a structure that includes a common electrode for the anode electrode of the diode and the emitter electrode of the IGBT, and a common electrode for the cathode electrode of the diode and the collector electrode of the IGBT. The diode-built-in IGBT is also called the "reverse conducting IGBT (RC-IGBT).

Figure 3:
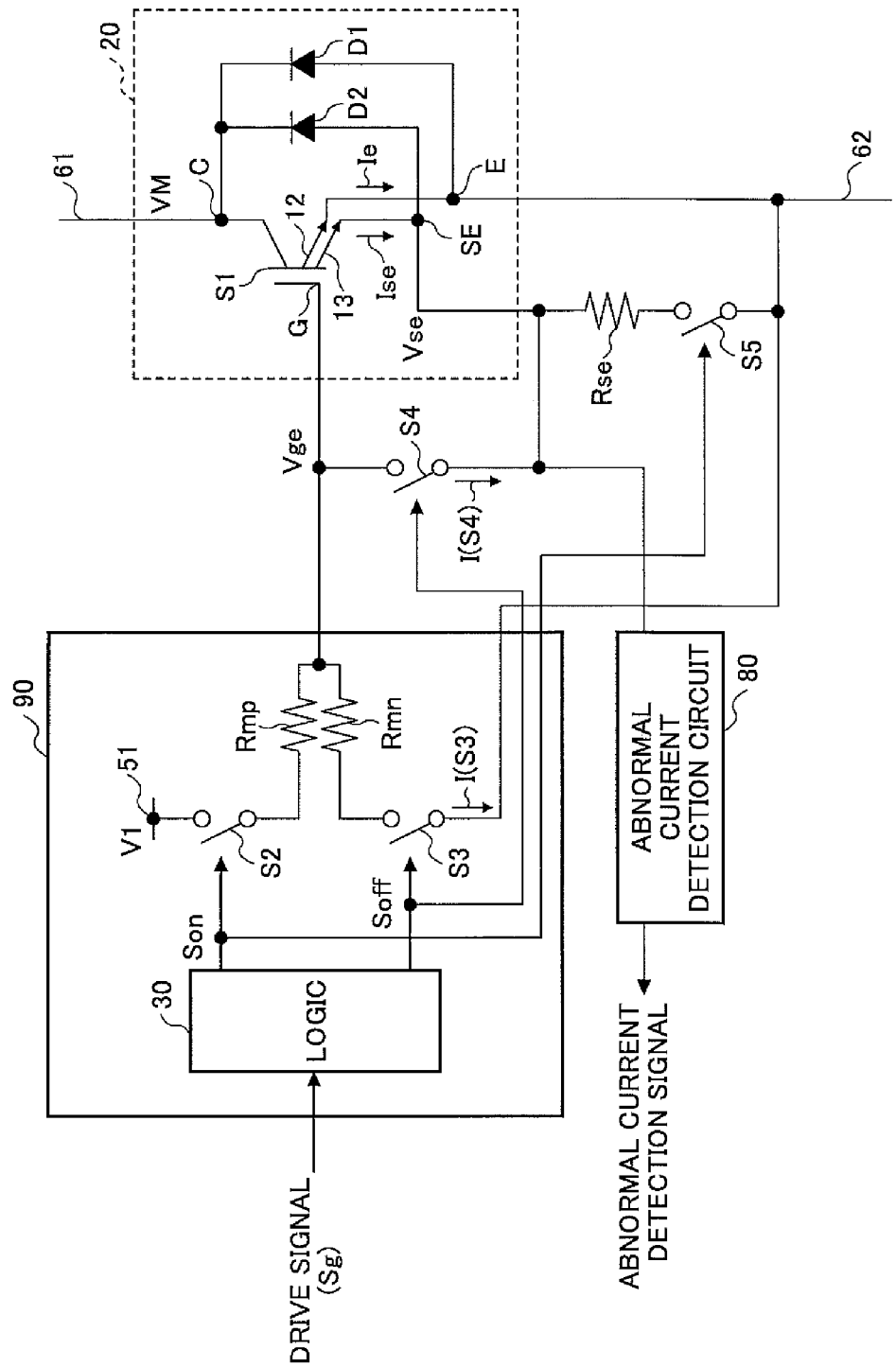
FIG. 3 is a configuration diagram illustrating an example of a semiconductor apparatus.

FIG. 3 is a diagram illustrating a configuration example of a drive apparatus 2 as an example of a semiconductor apparatus. Description is omitted here for the same elements and effects as in the embodiments described above. The drive apparatus 2 includes a resistor Rse, an abnormal current detection circuit 80, and a switch S5.

The resistor Rse is an example of a resistor that is connected between the sense emitter SE and the emitter E, and is, for example, a sense resistor that has one terminal connected with the sense emitter SE and the switch S4, and another terminal connected with the emitter E and the conductive part 62 via the switch S5.

The abnormal current detection circuit 80 is an example of an abnormality detection circuit that detects an abnormality of the principal current Ie, based on the sense emitter voltage Vse, which is a positive voltage generated between both terminals of the resistor Rse when the sense current Ise flows in the resistor Rse. The abnormal current detection circuit 80 detects an abnormal current (for example, an overcurrent or a short circuit current) that flows in the main transistor 12 of the switching element S1, for example, by monitoring the sense emitter voltage Vse during an on period of the switching element S1. For example, when detecting a positive sense emitter voltage Vse greater than or equal to a predetermined threshold voltage Vth, the abnormal current detection circuit 80 determines that the principal current Ie flowing in the main transistor 12 of the switching element S1 is an overcurrent, and outputs an abnormal current detection signal.

The switch S5 is an example of a cutoff circuit that cuts off the sense current Ise flowing in the resistor Rse when the switching element S1 turns off. The switch S5 is, for example, a transistor that is inserted in series between the resistor Rse and the emitter E.

At timing t1 when the drive signal Sg changes from an on command to an off command, the logic circuit 30 switches the gate-on switch S2 and the switch S5 from on to off, and switches the gate-off switch S3 and the switch S4 from off to on (see FIG. 2). This makes the switch S4 turned on, which can prevent a part of the electric charge moving from the gate G to the collector C via the sense diode D2, from flowing in the conductive part 62 via the resistor Rse. Therefore, even though the resistor Rse is connected between the sense emitter SE and the emitter E, the current I (S4) to charge the collector C can be increased, and hence, a turn-off operation of the switching element S1 can be sped up.

Figure 4:
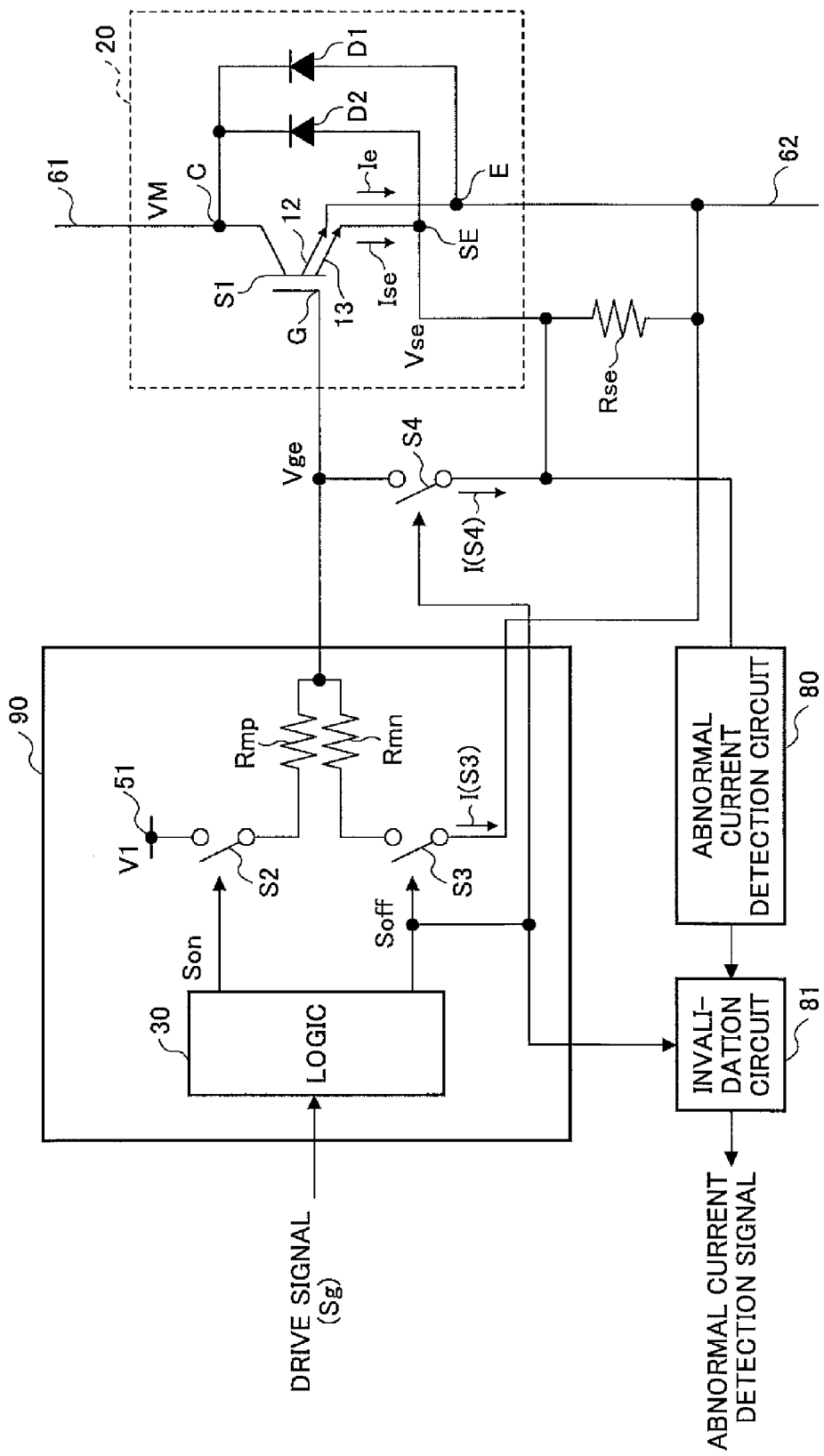
FIG. 4 is a configuration diagram illustrating an example of a semiconductor apparatus.

FIG. 4 is a diagram illustrating a configuration example of a drive apparatus 3 as an example of a semiconductor apparatus. Description is omitted here for the same elements and effects as in the embodiments described above. The drive apparatus 3 includes a resistor Rse, an abnormal current detection circuit 80, and an invalidation circuit 81.

The abnormal current detection circuit 80 is an example of an abnormality detection circuit that detects an abnormality of the principal current Ie, based on the sense emitter voltage Vse, which is a positive voltage generated between both terminals of the resistor Rse when the sense current Ise flows in the resistor Rse. For example, when detecting a positive sense emitter voltage Vse greater than or equal to a predetermined threshold voltage Vth, the abnormal current detection circuit 80 determines that the principal current Ie flowing in the main transistor 12 of the switching element S1 is an overcurrent, and outputs an abnormal current detection signal.

The invalidation circuit 81 is a circuit to invalidate the abnormal current detection signal when the switching element S1 turns off, and invalidates the abnormal current detection signal, for example, when the turn-off signal Soff is input that turns on the gate-off switch S3 and the switch S4.

By having the switch S4 turned on, the gate G is connected with the sense emitter SE, and hence, the sense emitter voltage Vs temporarily rises closer to the gate voltage Vge (see FIG. 2). Therefore, if the sense emitter voltage Vse exceeds a threshold voltage Vth, an abnormal current detection signal is output. However, by having the abnormal current detection signal invalidated by the invalidation circuit 81, the drive apparatus 3 can avoid an erroneous determination of an abnormal current due to an erroneous output of the abnormal current detection signal.

Figure 5:
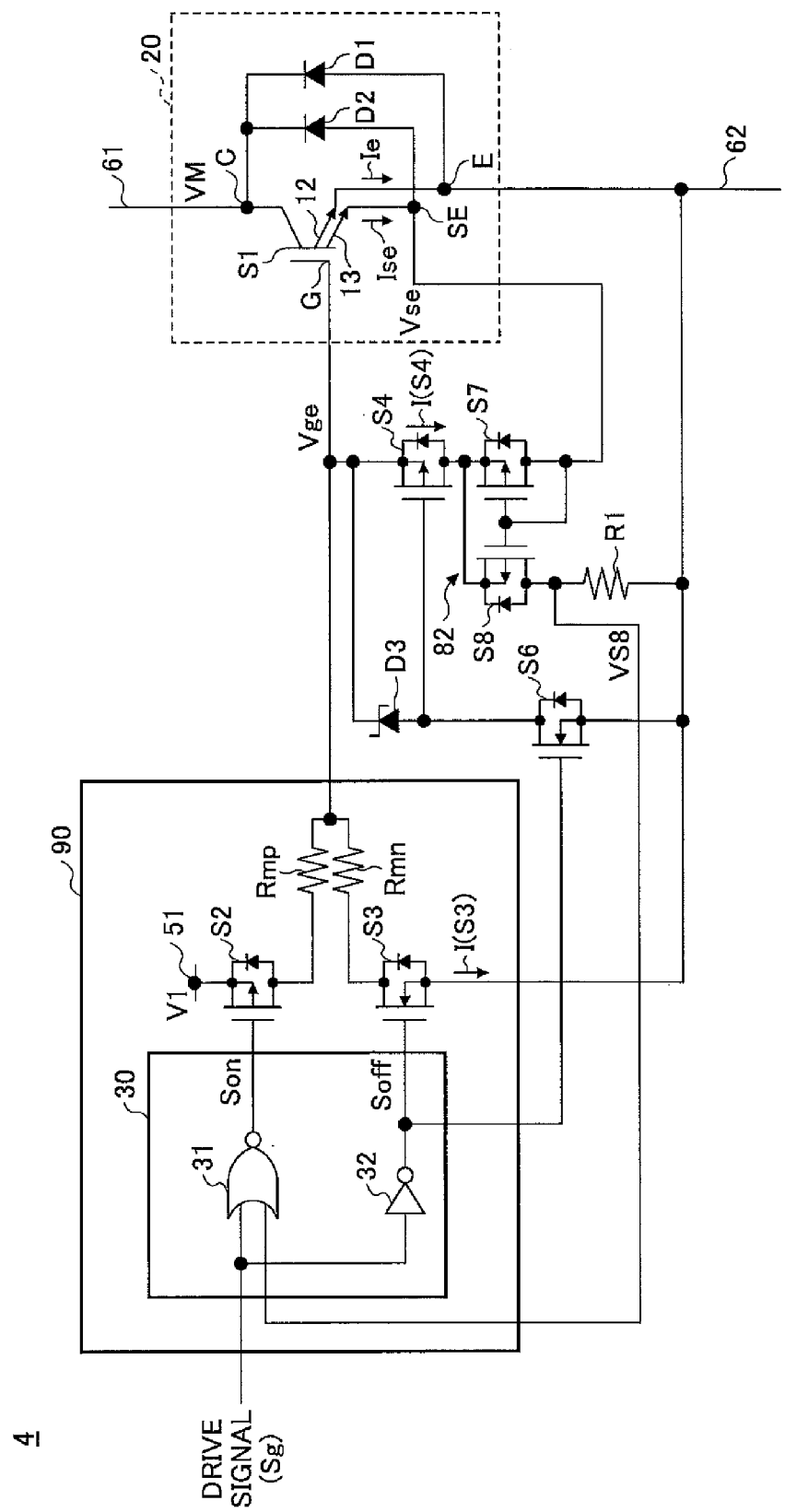
FIG. 5 is a configuration diagram illustrating an example of a semiconductor apparatus.

FIG. 5 is a diagram illustrating a configuration example of a drive apparatus 4 as an example of a semiconductor apparatus. Description is omitted here for the same elements and effects as in the embodiments described above. The drive apparatus 4 includes a current detection circuit 82, a NOR circuit 31, and an inverter circuit 32.

The current detection circuit 82 is a circuit to detect that the current I (S4) flows in the switch S4, and includes, for example, MOS transistors S7 and S8, and a resistor R1 that constitute a current mirror. The switch S4 is a P-channel MOSFET in the case of FIG. 5. The P-channel MOS transistor S7 is inserted in series and connected between the switch S4 and the sense emitter SE. The P-channel MOS transistor S8 has a source connected with a connection point between the switch S4 and MOS transistor S7, and a drain connected with the conductive part 62 via a resistor R1.

During a period while the current I (S4) flows, since a current depending on the current I (S4) flows in the resistor R1, the current detection circuit 82 outputs a high-level current detection signal VS8. On the other hand, during a period while the current I (S4) does not flow, since a current depending on the current I (S4) does not flow in the resistor R1, the current detection circuit 82 outputs a low-level current detection signal VS8.

The NOR circuit 31 is an example of a pull-up control circuit that maintains a state where the gate G is pulled up to the drive power source 51, until the current I (S4) flowing in the switch S4 reduces to a predetermined non-negative current value or below.

When at least one of the drive signal Sg and the current detection signal VS8 takes the high level, the NOR circuit 31 outputs a low-level turn-on signal Son that turns on the gate-on switch S2. A high-level drive signal Sg represents a signal commanding to turn on the switching element S1, and a high-level current detection signal VS8 represents that the current I (S4) flows. On the other hand, when both the drive signal Sg and the current detection signal VS8 take the low level, the NOR circuit 31 outputs a high-level turn-on signal Son that turns off the gate-on switch S2. A low-level drive signal Sg represents a signal commanding to turn off the switching element S1, and a low-level current detection signal VS8 represents that the current I (S4) does not flow.

When the drive signal Sg takes the high level, the invertor circuit 32 outputs a low-level turn-off signal Soff that turns off the gate-off switch S3, and when the drive signal Sg takes the low level, the invertor circuit 32 outputs a high-level turn-off signal Soff that turns on the gate-off switch S3.

When a low-level turn-off signal Soff is output that turns off the gate-off switch S3, the switch S6 turns off, and hence, the switch S4 turns off. When a high-level turn-off signal Soff is output that turns on the gate-off switch S3, the switch S6 turns on, and hence, the switch S4 turns on. The gate voltage to turn on the switch S4 is generated by having the power supply voltage V1 of the drive power source 51 clamped by a Zener diode D3.

Figure 6:
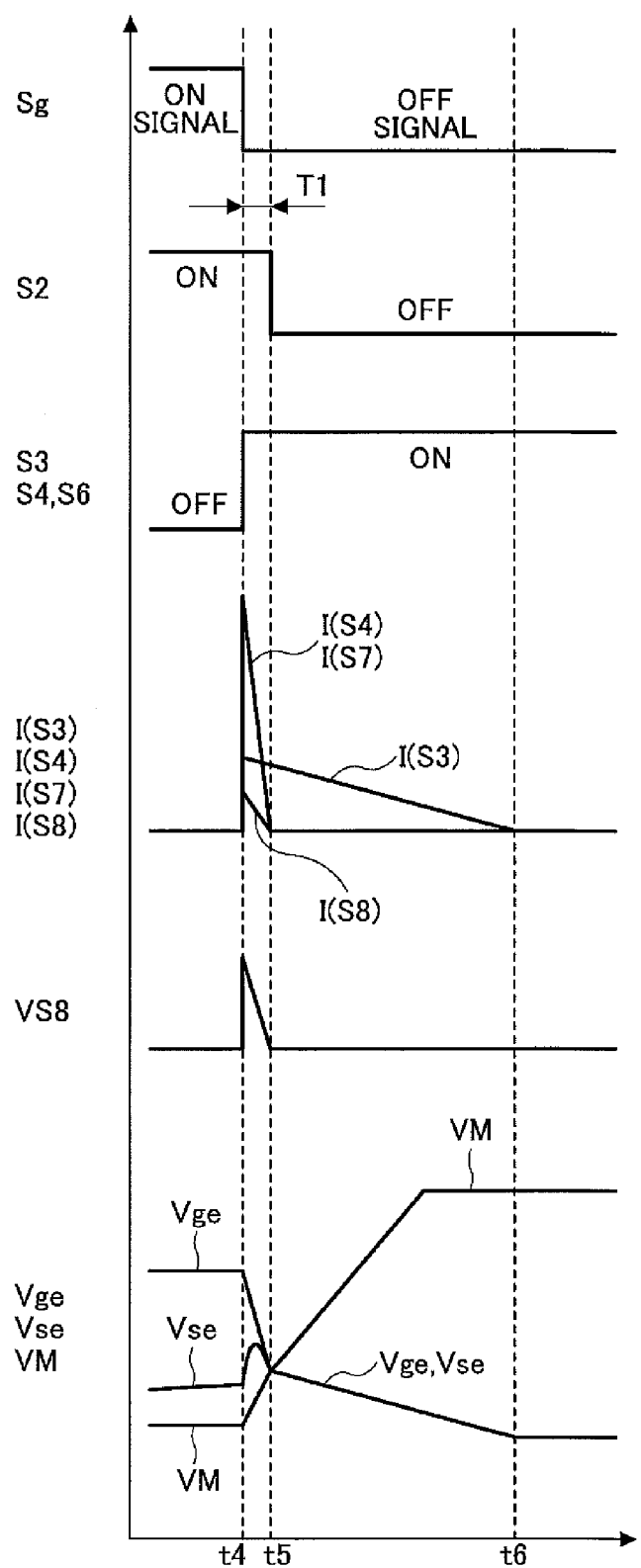
FIG. 6 is a timing chart illustrating an example of an operational waveform of a semiconductor apparatus.

Therefore, as illustrated in FIG. 6, the NOR circuit 31 can delay a timing to switch the gate-on switch S2 from on to off by time T1. Consequently, the current I (S4) flowing in the collector C via the sense diode D2 can be increased by the amount of the current flowing from the drive power source 51 by turning on the gate-on switch S2, and hence, a turn-off operation of the switching element S1 can be further sped up.

Figure 7:
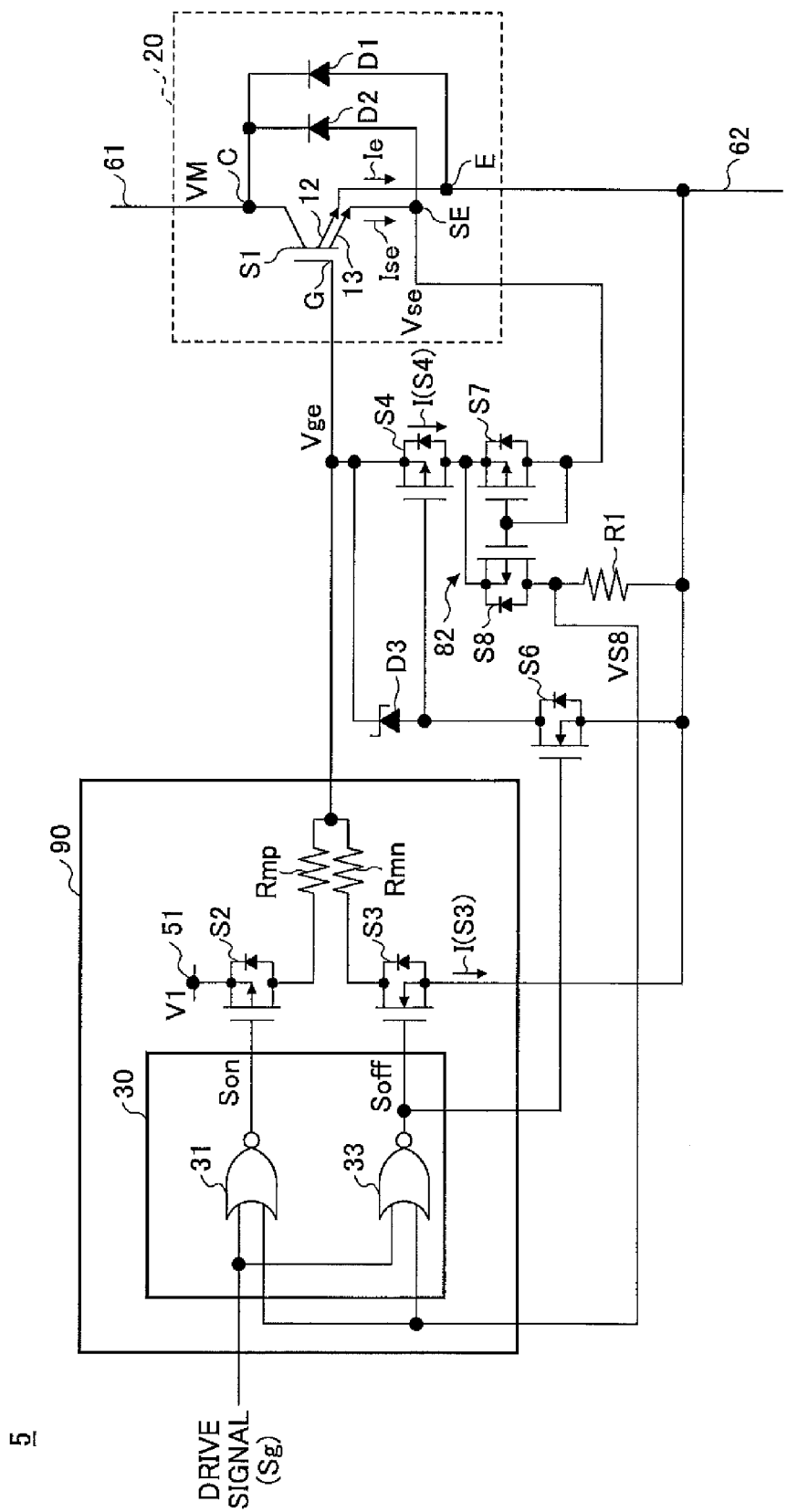
FIG. 7 is a configuration diagram illustrating an example of a semiconductor apparatus.

FIG. 7 is a diagram illustrating a configuration example of a drive apparatus 5 as an example of a semiconductor apparatus. Description is omitted here for the same elements and effects as in the embodiments described above. The drive apparatus 5 includes a current detection circuit 82, a NOR circuit 31, and a NOR circuit 33.

The NOR circuit 33 is an example of a pull-down control circuit that maintains a state where the gate G is pulled down to the conductive part 62, until the current I (S4) flowing in the switch S4 reduces to a predetermined non-negative current value or below. Note that the logical relationship between the input and output of the NOR circuit 33 is the same as that of the NOR circuit 31.

Figure 8:
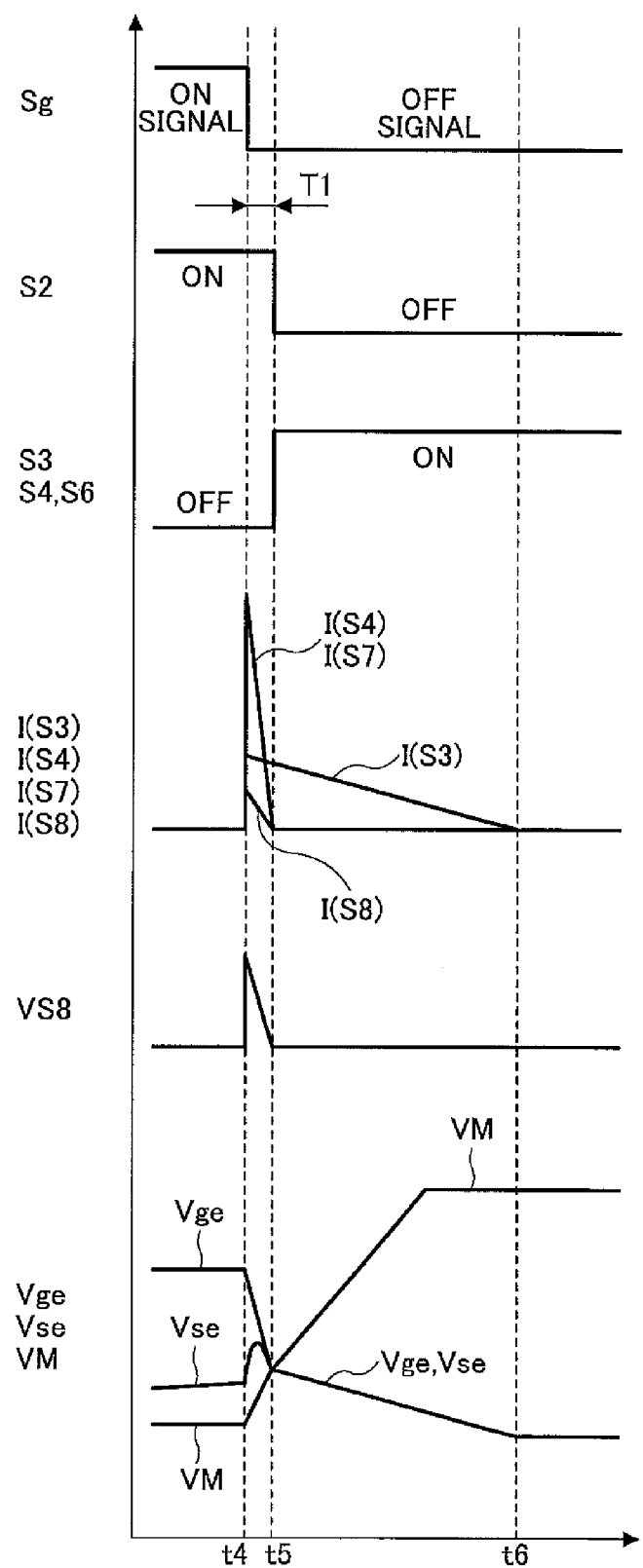
FIG. 8 is a timing chart illustrating an example of an operational waveform of a semiconductor apparatus.

As illustrated in FIG. 8, the drive apparatus 5 having the NOR circuit 33 can delay a timing to switch the gate-off switch S3 from off to on by time T1, and hence, can prevent the current I (S4) from reducing when the gate-off switch S3 turns on. Namely, the current flowing in the gate-off switch S3 during time T1 can be redirected to the switch S4, and hence, the current I (S4) can be increased. Thus, a turn-off operation of the switching element S1 can be further sped up.

Although the semiconductor apparatus is described with the embodiments as above, the present invention is not limited to the above embodiments. Various modifications and improvements can be made within the scope of the present invention by combining and/or replacing a part of or all of the embodiments with the others.

For example, the semiconductor apparatus may be a semiconductor apparatus that has a configuration including an integrated circuit, or a semiconductor apparatus that has a configuration including discrete parts.

The transistor S1 may be a switching element other than an IGBT, for example, an N-channel or P-channel MOSFET. In a case of a MOSFET, the wording may be changed to read a "collector" as a "drain", and an "emitter" as a "source".

Also, transistors other than the switching element S1 may be NPN-type or PNP-type bipolar transistors.

The present application is based on Japanese Priority Application No. 2014-146223, filed on Jul. 16, 2014, the entire contents of which are hereby incorporated by reference.

The invention claimed is:

1. A semiconductor apparatus, comprising:
   a switching element including a gate electrode, a first main electrode, a second main electrode, a sense electrode to output a sense current smaller than a principal current depending on the principal current flowing in the first main electrode, and to turn off when a control voltage being applied between the gate electrode and the first main electrode is reduced;
   a main diode including an anode connected with the first main electrode. and a cathode connected with the second main electrode:
   a sense diode including an anode connected with the sense electrode, and a cathode connected with the second main electrode; and
   a connection circuit configured to connect the gate electrode with the sense electrode when the switching element turns off.

2. The semiconductor apparatus, as claimed in claim 1, further comprising:
   a resistor connected between the sense electrode and the first main electrode;
   an abnormality detection circuit configured to detect an abnormality of the principal current based on a voltage being generated when the sense current flows in the resistor; and
   a cutoff circuit configured to cut off the sense current so that the sense current does not flow in the resistor when the switching element turns off.

3. The semiconductor apparatus, as claimed in claim 1, further comprising:
   a resistor connected between the sense electrode and the first main electrode;
   an abnormality detection circuit configured to detect an abnormality of the principal current based on a voltage being generated when the sense current flows in the resistor; and
   an invalidation circuit configured to invalidate an output signal of the abnormality detection circuit when the switching element turns off.

4. The semiconductor apparatus, as claimed in claim 1, further comprising:
   a pull-up control circuit configured to maintain a state where the gate electrode is pulled up to a drive power source, until a current flowing in the connection circuit reduces to a predetermined current value or below.

5. The semiconductor apparatus, as claimed in claim 1, further comprising:
   a pull-down control circuit configured to maintain a state where the gate electrode is pulled down to the second main electrode, until a current flowing in the connection circuit reduces to a predetermined current value or below.

* * * * *